United States Patent
Hirano

(10) Patent No.: US 10,583,608 B2
(45) Date of Patent: Mar. 10, 2020

(54) LITHOGRAPHY APPARATUS, CONTROL METHOD THEREFOR, AND METHOD OF MANUFACTURING ARTICLE

(71) Applicant: CANON KABUSHIKI KAISHA, Tokyo (JP)

(72) Inventor: Shinichi Hirano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 224 days.

(21) Appl. No.: 15/013,458

(22) Filed: Feb. 2, 2016

(65) Prior Publication Data

US 2016/0231648 A1 Aug. 11, 2016

(30) Foreign Application Priority Data

Feb. 9, 2015 (JP) ................................. 2015-023543
Jan. 12, 2016 (JP) ................................. 2016-003695

(51) Int. Cl.
| | |
|---|---|
| *B29C 64/386* | (2017.01) |
| *G03F 7/00* | (2006.01) |
| *B29C 64/20* | (2017.01) |
| *G03F 7/20* | (2006.01) |
| *G03F 9/00* | (2006.01) |
| *B29C 64/393* | (2017.01) |

(52) U.S. Cl.
CPC .......... *B29C 64/386* (2017.08); *B29C 64/20* (2017.08); *G03F 7/00* (2013.01); *G03F 7/0002* (2013.01); *B29C 64/393* (2017.08); *G03F 7/0037* (2013.01); *G03F 9/00* (2013.01); *G03F 2007/2067* (2013.01); *G03F 2009/005* (2013.01)

(58) Field of Classification Search
CPC . G03F 7/00; G03F 7/0037; G03F 7/70; G03F 7/70375; G03F 7/70383; G03F 7/70408; G03F 7/70416; G03F 7/70425; G03F 7/70508; G03F 1/16; G03F 1/70; G03F 2007/2067; G03F 9/00; G03F 9/70; G03F 9/7042; G03F 2009/005; B29C 64/00; B29C 64/10; B29C 64/20; B29C 64/386; B29C 64/393; H01L 21/67225
USPC ...................................................... 264/40.1
See application file for complete search history.

(56) References Cited

U.S. PATENT DOCUMENTS

| 7,224,442 B2 | 5/2007 | Kato et al. |
|---|---|---|
| 7,914,717 B2 | 3/2011 | Yamada et al. |

(Continued)

FOREIGN PATENT DOCUMENTS

| JP | 2005136295 A | 5/2005 |
|---|---|---|
| JP | 2010149482 A | 7/2010 |

(Continued)

*Primary Examiner* — Robert C Dye
*Assistant Examiner* — Sedef E Paquette
(74) *Attorney, Agent, or Firm* — Rossi, Kimms & McDowell LLP

(57) ABSTRACT

A lithography apparatus is provided. The lithography apparatus includes a control unit that obtains information of an expected processing count to be processed in a lot by a transfer unit, obtains information of an accumulated processing count, in the transfer unit, of each of originals in a original storage unit, and preferentially selects, from the originals, an original whose process enable count before the accumulated processing count reaches a predetermined count is not smaller than the expected processing count.

28 Claims, 11 Drawing Sheets

(56) References Cited

U.S. PATENT DOCUMENTS

2009/0304259 A1* 12/2009 Yamamoto ............ G06T 7/0004
   382/145
2010/0164146 A1 7/2010 Furutono et al.
2013/0056903 A1* 3/2013 Hayashi ................ G03F 7/0002
   264/293

FOREIGN PATENT DOCUMENTS

| JP | 2011017914 A | 1/2011 |
| WO | 2008129962 A1 | 10/2008 |
| WO | 2013094554 A1 | 6/2013 |

* cited by examiner

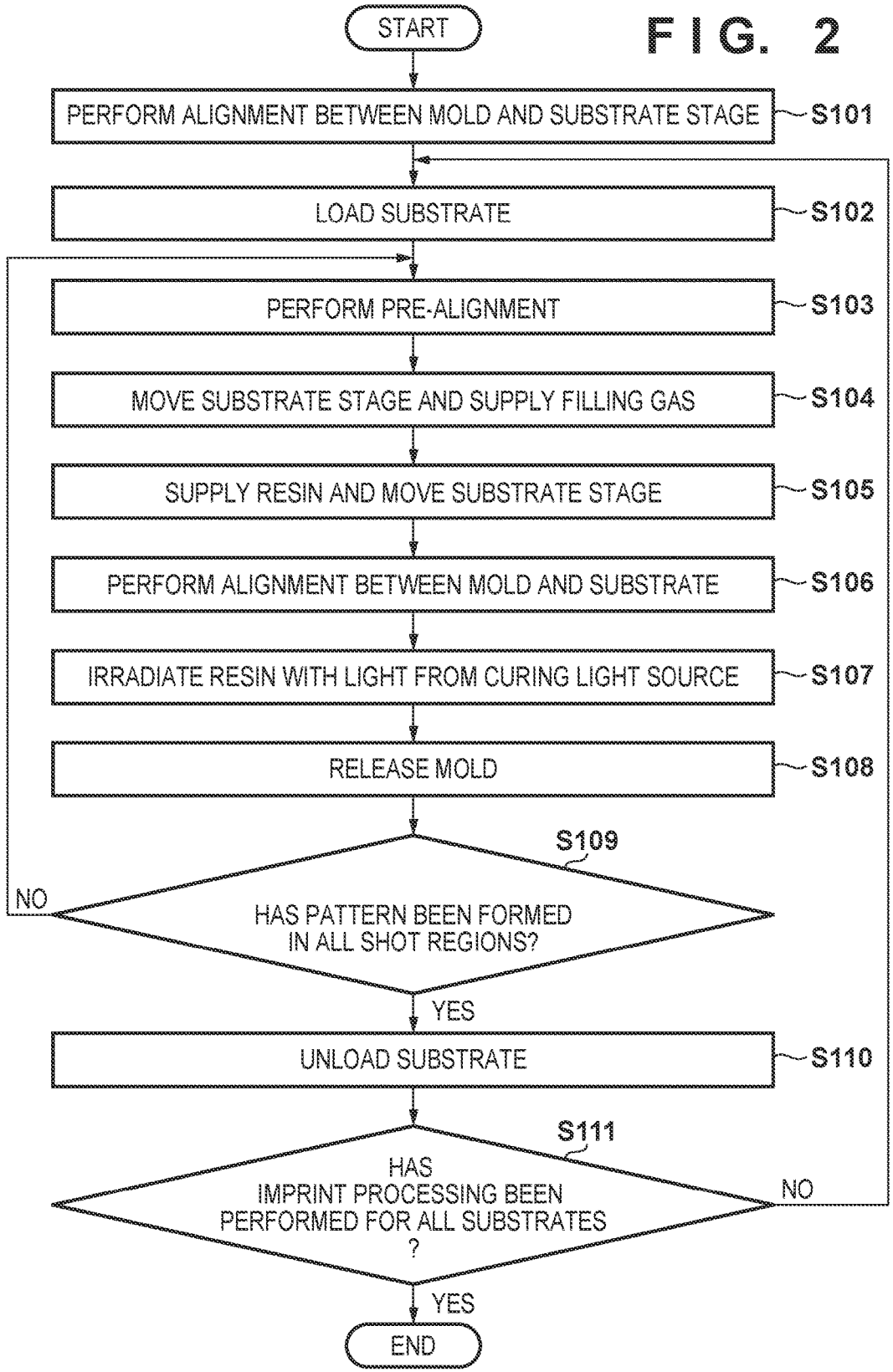

F I G. 6A

CONVENTIONAL TECHNIQUE

| ORIGINAL TYPE | ACCUMULATED PROCESSING COUNT | PROCESS ENABLE COUNT | FIRST LOT: 40<br>ACCUMULATED PROCESSING COUNT AFTER FIRST LOT PROCESSING | SECOND LOT: 20<br>ACCUMULATED PROCESSING COUNT AFTER SECOND LOT PROCESSING | THIRD LOT: 80<br>ACCUMULATED PROCESSING COUNT AFTER THIRD LOT PROCESSING |
|---|---|---|---|---|---|
| ORIGINAL A | 60 | 40 | 80 | 90 | 100 |
| ORIGINAL B | 90 | 10 | 100 | 100 | 100 |
| ORIGINAL C | 0 | 100 | 10 | 20 | 60 |
| ORIGINAL D | 80 | 20 | 80 | 80 | 100 |
| ORIGINAL E | 50 | 50 | 50 | 50 | 60 |
| TOTAL PROCESSING COUNT | 280 | 220 | 320 | 340 | 420 |

F I G. 6B

EMBODIMENT

| ORIGINAL TYPE | ACCUMULATED PROCESSING COUNT | PROCESS ENABLE COUNT | FIRST LOT: 40 ACCUMULATED PROCESSING COUNT AFTER FIRST LOT PROCESSING | SECOND LOT: 20 ACCUMULATED PROCESSING COUNT AFTER SECOND LOT PROCESSING | THIRD LOT: 80 ACCUMULATED PROCESSING COUNT AFTER THIRD LOT PROCESSING |
|---|---|---|---|---|---|
| ORIGINAL A | 60 | 40 | 80 | 90 | 90 |
| ORIGINAL B | 90 | 10 | 90 | 100 | 100 |
| ORIGINAL C | 0 | 100 | 0 | 0 | 40 |
| ORIGINAL D | 80 | 20 | 100 | 100 | 100 |
| ORIGINAL E | 50 | 50 | 50 | 50 | 90 |
| TOTAL PROCESSING COUNT | 280 | 220 | 320 | 340 | 420 |

FIG. 7
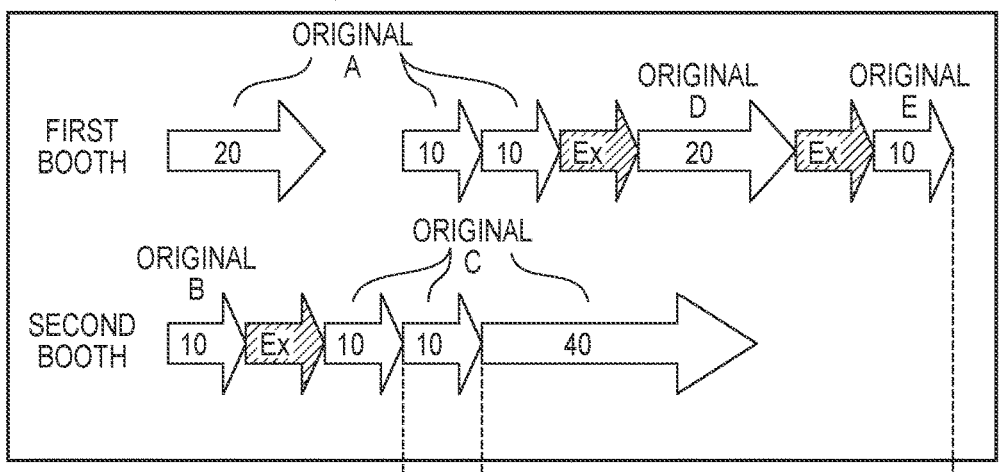
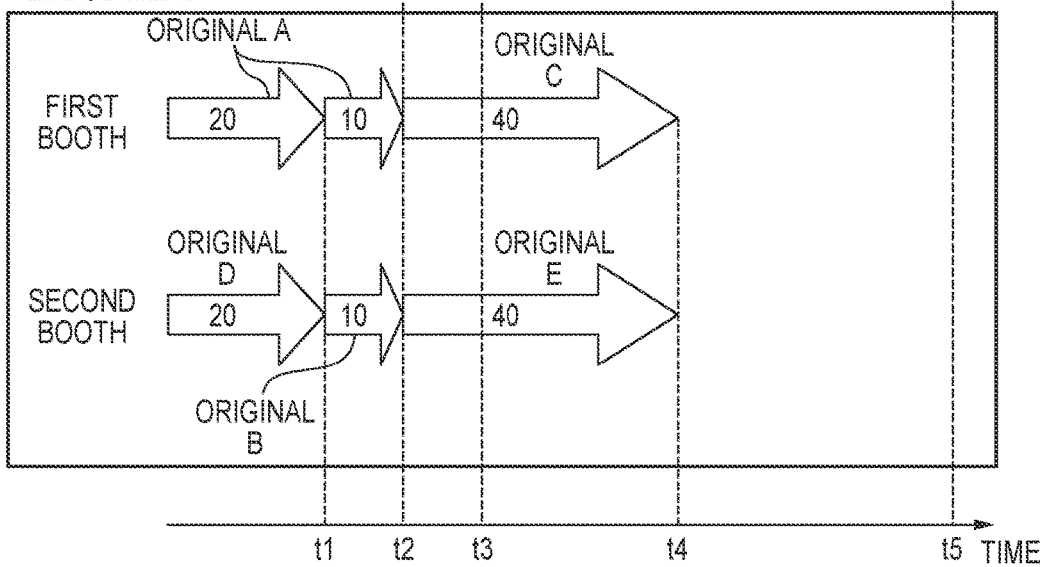

LITHOGRAPHY APPARATUS, CONTROL METHOD THEREFOR, AND METHOD OF MANUFACTURING ARTICLE

BACKGROUND OF THE INVENTION

Field of the Invention

The present invention relates to a lithography technique.

Description of the Related Art

An imprint technique is a technique capable of forming (transferring) a nanoscale pattern. An imprint apparatus using the technique is attracting attention as one of lithography apparatuses for mass-producing magnetic storage media and semiconductor devices. The imprint apparatus forms a pattern of an imprint material on a substrate (silicon wafer, glass plate, or the like) by curing the imprint material while the imprint material on the substrate and an original (mold) are in contact with each other, and then separating (releasing) the original from the cured imprint material.

In an imprint apparatus or semiconductor exposure apparatus, it is necessary to grasp the replacement time or cleaning time of an original. Japanese Patent Laid-Open No. 2011-017914 discloses a method of estimating the deterioration state of a photo mask as an original using a photo mask inspection apparatus in an exposure apparatus.

However, even if the deterioration state is estimated using such method, the productivity may decrease. If, for example, an original reaches its use limit during lot processing, the lot processing is interrupted to start an operation of replacing the original. A decrease in productivity caused by such original replacement operation cannot be neglected.

Furthermore, if lot processing is interrupted to replace an original during the lot processing, a manufacturing error of a product may fail outside an allowable range due to a change in apparatus state caused by the interruption. Especially in a lithography apparatus in which one chamber accommodates two or more pattern transfer units, when an original is replaced only in a specific transfer mechanism (a pattern transfer unit), variations in the same lot may fall outside the allowable range, thereby decreasing the product yield.

SUMMARY OF THE INVENTION

The present invention provides, for example, a lithography apparatus capable of suppressing a decrease in productivity or product yield caused by interruption of lot processing.

According to one aspect of the present invention, a lithography apparatus comprises a transfer unit configured to transfer, to a substrate, a pattern formed on an original, an original storage unit configured to store a plurality of originals, a control unit configured to select, from the plurality of originals, an original to be used by the transfer unit, and a conveyance unit configured to extract, from the original storage unit, the original selected by the control unit, and convey the extracted original to an original holding position of the transfer unit, wherein the control unit obtains information of an expected processing count to be processed in a lot by the transfer unit, obtains information of an accumulated processing count, in the transfer unit, of each of the originals in the original storage unit, and preferentially selects, from the plurality of originals, an original whose process enable count before the accumulated processing count reaches a predetermined count is not smaller than the expected processing count.

Further features of the present invention will become apparent from the following description of exemplary embodiments (with reference to the attached drawings).

BRIEF DESCRIPTION OF THE DRAWINGS

FIG. 2 is a flowchart illustrating imprint processing according to the embodiment;

FIGS. 6A and 6B are tables for explaining, by comparison with a conventional technique, the accumulated processed substrate counts of a plurality of originals according to the embodiment;

FIG. 7 is a view for explaining, by comparison with the conventional technique, the use order of the plurality of originals according to the embodiment;

DESCRIPTION OF THE EMBODIMENTS

Figure 1:
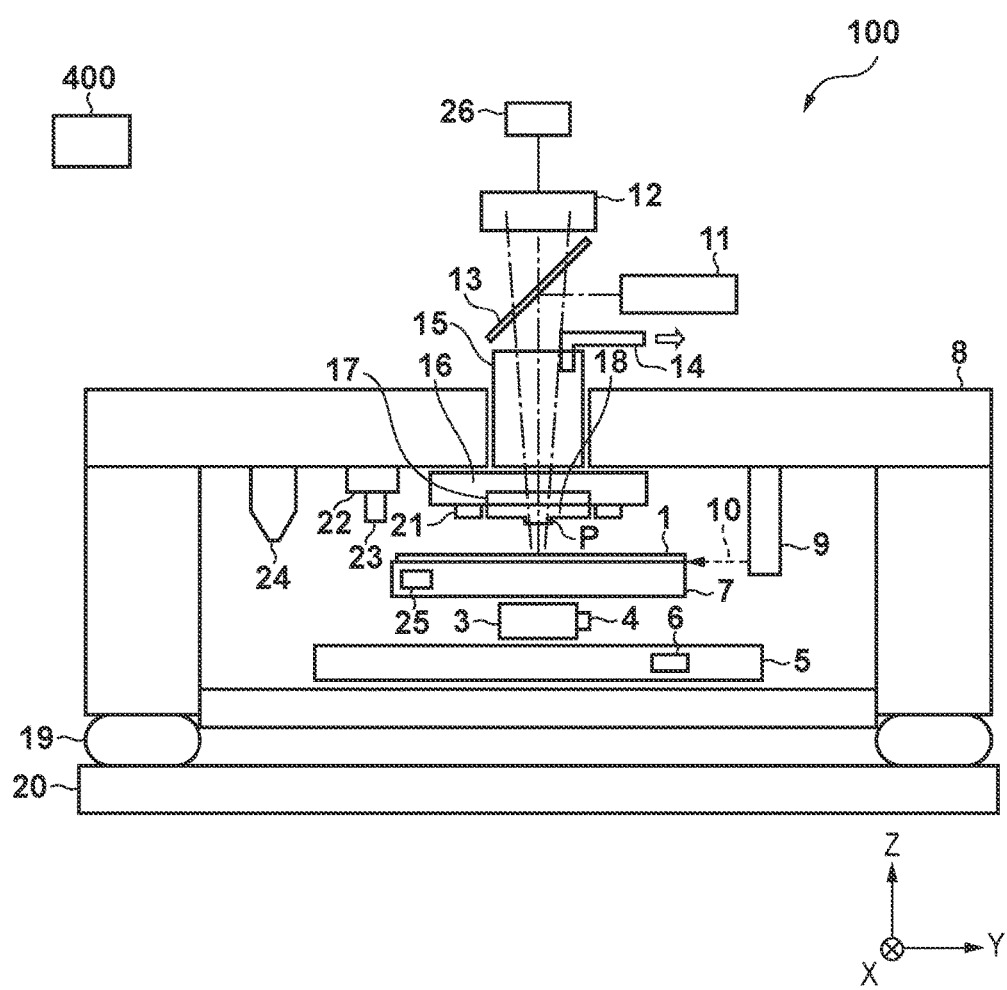
FIG. 1 is a view showing the arrangement of an imprint processing unit according to an embodiment.

Various exemplary embodiments, features, and aspects of the invention will be described in detail below with reference to the drawings. Note that not all the combinations of features described in the embodiments are necessarily essential to the solving means of the present invention. The same reference numerals denote the same members throughout the drawings, and a repetitive description thereof will be omitted.

First Embodiment

This embodiment relates to a lithography apparatus for performing imprint processing of forming a pattern of an imprint material on a substrate by molding the imprint material on the substrate using a mold as an original (mask). FIG. 1 is a view showing the arrangement of an imprint processing unit 100 serving as a transfer unit in an imprint apparatus according to the embodiment. As a practical embodiment, one chamber can accommodate one, two, or more imprint processing units 100 to operate the imprint apparatus. Such forms will be described later with reference to FIGS. 4 and 5.

The imprint processing unit 100 according to this embodiment uses a resin as an imprint material. As a resin curing method, a photo-curing method of curing a resin by irradiation with ultraviolet light (UV light) is adopted. Therefore, the imprint processing unit 100 forms (transfers) a pattern on a substrate by supplying a resin to the substrate and curing the resin while the resin and the pattern surface of an original are in contact with each other. Note that the imprint processing unit 100 may cure the resin by irradiation with light in another wavelength range, or a heat-curing method of curing a resin by another energy, for example, heat may be adopted. Furthermore, a direction parallel to the optical axis of ultraviolet light with which the resin on the substrate is irradiated is set as the Z-axis, and directions orthogonal to each other within a plane perpendicular to the Z-axis are set as the X- and Y-axes.

The imprint processing unit 100 includes a measurement device 4, a measurement device 6, a substrate stage 7, a bridge structure 8, a measurement device 9, a curing light source 11, an alignment measurement unit 12, a half mirror 13, an exhaust duct 14, a connecting member 15, and an original head 16. The imprint processing unit 100 also includes an original chuck 17, gas springs 19, a base surface plate 20, a gas supply unit 21, a holder 22, a resin supply unit 23, an off-axis scope 24, a pressure sensor 25, a signal processing unit 26, and a control unit 400.

The original head 16 includes an original chuck 17 for holding an original 18 with a pattern surface P. On the pattern surface P of the original 18, a three-dimensional pattern corresponding to a pattern to be formed on a substrate 1 (wafer) is formed.

The original chuck 17 holds the original 18 by, for example, vacuum suction. The original chuck 17 has a structure of preventing the original 18 from dropping off from the original chuck 17. In this embodiment, the original chuck 17 is solidly coupled to the original head 16. Thus, the original head 16 can be regarded as part of the original chuck 17 or a member coupled to the original chuck 17. The original head 16 has a mechanism capable of moving (driving) itself in at least three axis directions of Z, $\omega$X, and $\omega$Y with reference to the bridge structure 8.

The original head 16 is supported by the bridge structure 8 via the connecting member 15. Similarly to the original head 16, the alignment measurement unit 12 forming an alignment detection system is also supported by the bridge structure 8.

The alignment measurement unit 12 performs alignment measurement for alignment between the original 18 and the substrate 1. In this embodiment, the alignment measurement unit 12 includes an alignment detection system for generating an alignment signal by detecting a mark provided on the original 18 and a mark provided on the substrate stage 7 or substrate 1. Furthermore, the alignment measurement unit 12 may include a camera, and have a function of observing (confirming), via the half mirror 13, the cured state (imprint state) of the resin on the substrate. In this case, the alignment measurement unit 12 can observe not only the cured state of the resin on the substrate but also the pressing state of the original 18 on the resin on the substrate, the filling state of the original 18 with the resin on the substrate, and the release state of the original 18 from the cured resin on the substrate.

The half mirror 13 is arranged above the connecting member 15. Light from the curing light source 11 is reflected by the half mirror 13, and transmitted through the original 18, thereby irradiating the resin on the substrate 1. The resin on the substrate 1 is cured by irradiation with light from the curing light source 11.

The bridge structure 8 is supported by the base surface plate 20 via the gas springs 19 for insulating a vibration from the floor. Each gas spring 19 has a structure generally adopted as an active anti-vibration function by an exposure apparatus. For example, each gas spring 19 includes an XYZ relative position measurement sensor, an XYZ driving linear motor, and a servo valve for controlling the amount of air in the gas spring, which are provided in the bridge structure 8 and the base surface plate 20.

The resin supply unit 23 (dispenser) including a nozzle for supplying (applying) the resin to the substrate 1 is attached to the bridge structure 8 via the holder 22. The resin supply unit 23 linearly supplies droplets of the resin to the substrate 1 using, for example, the inkjet head of an inkjet printer. It is possible to apply the resin to a rectangular region on the substrate by moving (scanning) the substrate stage 7 (that is, the substrate 1) while supplying the resin from the resin supply unit 23 to the substrate 1. Note that a region on the substrate to which the resin is applied need not have a rectangular shape, and the resin can be supplied to a region of an arbitrary shape (for example, a circle or sector).

In this embodiment, the substrate 1 has a circular shape. Therefore, when a rectangular shot region is defined on the substrate, the shot region protrudes from the substrate 1 (the periphery thereof) in a peripheral region (a region including the periphery of the substrate 1), and it is impossible to ensure the rectangular shot region. The shot region is generally called a "deficient shot region". Currently, a plurality of chips can be formed in one shot region of 33 mm×26 mm. Therefore, to efficiently form chips on the substrate 1, it is necessary to form a pattern even in a deficient shot region.

Furthermore, in the imprint processing unit 100, since a layer (residual layer) of the resin remains in the concave portions of the three-dimensional pattern formed to the resin on the substrate 1, the residual layer needs to be etched. The thickness of the residual layer will be referred to as RLT (Residual Layer Thickness) hereinafter. If no layer of a thickness corresponding to RLT is formed in a shot region, the substrate 1 is unwantedly hollowed out by etching. To prevent this, it is effective to apply the resin to the peripheral region of the substrate 1, that is, the deficient shot region. Note that if the resin supply unit 23 applies the resin in a rectangular shape at this time, the resin protrudes from the substrate 1. In this state, if the curing light source 11 emits light, the resin is cured and attached on a holding surface (for example, a substrate chuck provided on the substrate stage 7) for holding the substrate 1. Consequently, in addition to adhesion of the substrate 1 to the holding surface, the substrate 1 to undergo imprint processing next is held via the adherent (cured resin), and the profile irregularity of the surface of the substrate 1 decreases, thereby disabling normal formation of the pattern. To solve this problem, in this embodiment, the resin is applied to an appropriate region on the substrate 1 by a combination of discharge of the resin by the resin supply unit 23 and movement of the substrate stage 7.

The substrate stage 7 holds, for example, the substrate 1 via the substrate chuck. The substrate stage 7 has a mechanism capable of moving (driving) itself in six axis directions of X, Y, Z, $\omega$X, $\omega$Y, and $\omega$Z. In this embodiment, the substrate stage 7 is supported by the bridge structure 8 via an X slider 3 including an X-direction moving mechanism and a Y slider 5 including a Y-direction moving mechanism. The measurement device 4 for measuring the relative positions of the X slider 3 and Y slider 5 is provided in the X slider 3. The measurement device 6 for measuring the relative positions of the Y slider 5 and bridge structure 8 is provided in the Y slider 5. Therefore, the measurement devices 4 and 6 measure the position of the substrate stage 7 with reference to the bridge structure 8. In this embodiment, each of the measurement devices 4 and 6 is formed by an encoder (linear encoder).

The distance in the 7 direction between the substrate stage 7 and the bridge structure 8 is determined by the bridge structure 8, the X slider 3, and the Y slider 5. It is possible to suppress a variation of the imprint operation in the Z-direction of the substrate stage 7 and the bridge structure 8 to a variation of about several tens of nm by maintaining rigidities in the Z and tilt directions of the X slider 3 and Y slider 5 at a value as high as about 10 nm/N.

The measurement device 9 is provided in the bridge structure 8, and is formed by an interferometer in this embodiment. The measurement device 9 measures the position of the substrate stage 7 by emitting measurement light 10 toward the substrate stage 7 and detecting the measurement light 10 reflected by an interferometer mirror provided on an end face of the substrate stage 7. The measurement device 9 measures the position of the substrate stage 7 at a position closer than the measurement devices 4 and 6 with respect to the holding surface of the substrate 1 of the substrate stage 7. Note that only one beam of the measurement light 10 emitted from the measurement device 9 to the substrate stage 7 is shown in FIG. 1 but the measurement device 9 is configured to measure at least the XY position, rotation amount, and tilt amount of the substrate stage 7.

To improve the filling property of the resin in the pattern of the original 18, the gas supply unit 21 supplies a filling gas in the vicinity of the original 18, more specifically, a space between the original 18 and the substrate 1. The filling gas includes at least one of a permeable gas and a condensable gas in order to quickly decrease the filling gas (bubbles) confined between the original 18 and the resin and accelerate filling of the pattern of the original 18 with the resin. The permeable gas is a gas which has high permeability with respect to the original 18, and is transmitted through the original 18 when the original 18 is pressed against the resin on the substrate (that is, during molding). The condensable gas is a gas which is liquefied (condensed) when the original 18 is pressed against the resin on the substrate (that is, during molding).

The off-axis scope 24 detects a reference mark or alignment mark provided on a reference plate arranged on the substrate stage 7 without intervention of the original 18. Furthermore, the off-axis scope 24 can detect an alignment mark provided in each shot region on the substrate 1.

In this embodiment, the pressure sensor 25 is provided in the substrate stage 7, and detects the pressure which acts on the substrate stage 7 by pressing the original 18 against the resin on the substrate. The pressure sensor 25 functions as a sensor for detecting the contact state between the original 18 and the resin on the substrate by detecting the pressure acting on the substrate stage 7. The pressure sensor 25 may be provided in the original head. 16, and need only be provided in at least one of the original head 16 and the substrate stage 7.

The control unit 400 includes a CPU and a memory, and comprehensively controls the operation of the imprint processing unit 100. In this embodiment, the control unit 400 controls imprint processing and its associated processing.

As described above, the gas supply unit 21 supplies a filling gas to the space between the original 18 and the substrate 1 while performing imprint processing. The filling gas supplied between the original 18 and the substrate 1 is sucked from the upper portion of the original head 16 via the exhaust duct 14, and exhausted outside the imprint processing unit 100. Furthermore, the filling gas supplied between the original 18 and the substrate 1 may be recovered by a gas recovery mechanism (not shown) instead of being exhausted outside the imprint processing unit 100.

The sequence of imprint processing by the imprint apparatus will be described with reference to a flowchart shown in FIG. 2. Explained here is the sequence of imprint processing in a lot including a plurality of substrates.

In step S101, the control unit 400 performs alignment between the original 18 and the substrate stage 7 based on the result of alignment measurement by the alignment measurement unit 12. At this time, the original 18 is loaded into the imprint processing unit 100 by an original conveyance system (not shown), and held by the original chuck 17. An alignment mark detected by the alignment measurement unit 12 may be provided as a dedicated reference mark on the substrate stage 7 or provided on a dedicated alignment substrate.

In step S102, the substrate 1 is loaded into the imprint processing unit 100 by a substrate conveyance system (not shown), and held by the substrate stage 7 (substrate chuck). In other words, the substrate 1 is fixed to the substrate stage 7.

In step S103, the control unit 400 performs pre-alignment (PA). More specifically, the control unit 400 moves the substrate stage 7 to a position below the off-axis scope 24, and causes the off-axis scope 24 to measure the position of the substrate 1 held by the substrate stage 7. In alignment (step S106) between the original 18 and the substrate 1, pre-alignment is performed with accuracy (about 1 μm to 2 μm) which makes an alignment mark provided in each shot region on the substrate 1 fall within the measurement range of the alignment measurement unit 12.

In step S104, the substrate stage 7 is moved so that a target shot region (a shot region to undergo imprint processing) on the substrate 1 is positioned below the resin supply unit 23. The gas supply unit 21 supplies a filling gas to the space between the original 18 and the substrate 1.

In step S105, the resin supply unit 23 supplies the resin to the target shot region on the substrate 1. More specifically, in accordance with a predetermined application pattern, the resin supply unit 23 supplies the resin to the target shot region on the substrate 1 moved to the position below the resin supply unit 23. After the resin is supplied to the target shot region on the substrate 1, the substrate stage 7 is moved so that the target shot region is positioned below the pattern surface P of the original 18.

In step S106, the control unit 400 performs alignment between the original 18 and the target shot region on the substrate 1 based on the result of alignment measurement by the alignment measurement unit 12 while the pattern surface P of the original 18 and the resin on the substrate are in contact with each other. Since such alignment is performed for each shot region (die) of the substrate 1, it is called "die-by-die alignment".

In step S107, the control unit 400 irradiates the resin on the target shot region on the substrate 1 with light from the curing light source 11 while the pattern surface P of the original 18 and the resin on the substrate are in contact with each other (that is, via the original 18).

In step S108, by raising the original head 16, the original 18 is separated (released) from the cured resin on the target shot region on the substrate 1. As a result, a resin pattern corresponding to the pattern surface P of the original 18 remains in the target shot region on the substrate 1. That is, the pattern corresponding to the pattern surface P of the original 18 is formed in the target shot region on the substrate 1. Note that when releasing the original 18, the original head 16 is raised so that a shearing force acting on the pattern surface P of the original 18 becomes smaller than the rupture stress of the resin pattern so as not to rupture the resin pattern.

In step S109, the control unit 400 determines whether the pattern has been formed in all the shot regions on the substrate 1. If the pattern has not been formed in all the shot regions, the process transits to step S103 to form the pattern in the next target shot region; otherwise, the process transits to step S110.

In step S110, the substrate conveyance system (not shown) unloads the substrate 1 on which the pattern has been formed in all the shot regions.

In step S111, the control unit 400 determines whether imprint processing has been performed for all the substrates 1. If imprint processing has not been performed for all the substrates 1, the process transits to step S102 to perform imprint processing for the next substrate 1; otherwise, the processing ends.

FIGS. 3A to 3F are views for explaining deterioration of an original caused by repeating imprint processing.

Figure 3A:
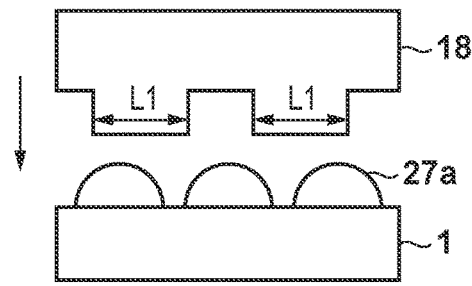
FIGS. 3A to 3F are views for explaining deterioration of an original caused by repeating imprint processing.

FIG. 3A shows a state before the pattern surface of the original 18 starts to contact the substrate 1 on which a resin 27a has been supplied to the target shot region by the resin supply unit 23. FIG. 3B shows a state in which the pattern surface of the original 18 and the resin on the substrate are in contact with each other. In this state, the resin on the target shot region on the substrate 1 is irradiated with light from the curing light source 11. At this time, a resin 27b is cured. FIG. 3C shows a state in which the original 18 has been separated from the cured resin on the target shot region on the substrate 1 by raising the original head 16. As a result, a resin pattern 27c corresponding to the pattern surface of the original 18 remains in the target shot region on the substrate 1.

Figure 3D:
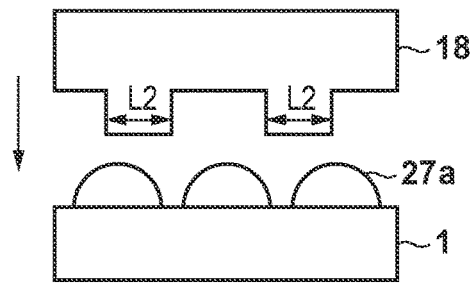
Figure 3B:
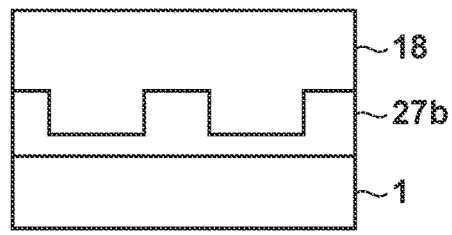
Figure 3E:
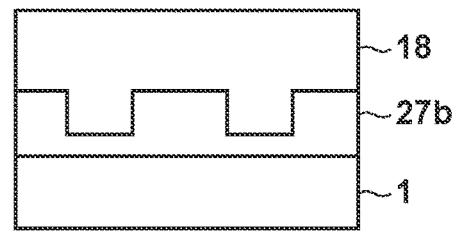
Figure 3C:
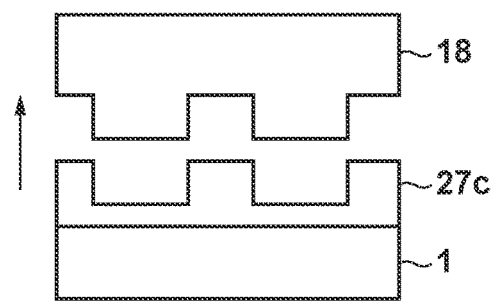
Figure 3F:
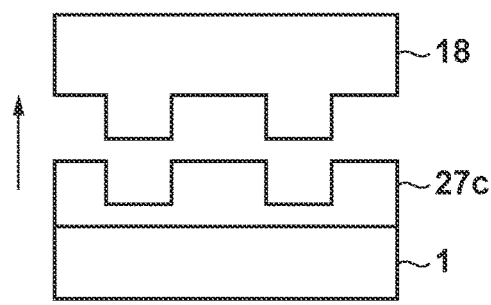

A processing sequence shown in FIGS. 3D to 3F is the same as that shown in FIGS. 3A to 3C. FIG. 3D shows a state in which the pattern surface of the original 18 deteriorates by repeating imprint processing, and a width L2 of a convex portion is narrower than a width L1 of a convex portion shown in FIG. 3A before deterioration. Therefore, the shape of the formed resin pattern 27c is different between FIGS. 3C and 3F. If the difference in shape is larger than an allowable value, the substrate is determined as a defective substrate, and is thus unusable.

Figure 4:
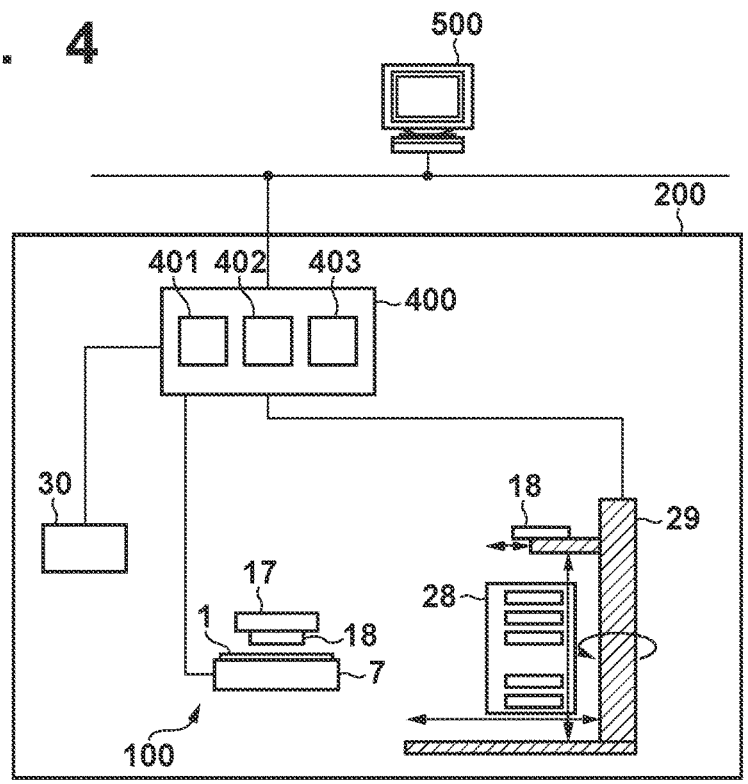
FIG. 4 is a view showing the arrangement of an imprint apparatus in which a chamber accommodates one imprint processing unit shown in FIG. 1.

The present inventor found by experiment that, for example, the following parameters are correlated with a factor of the deterioration of the pattern surface of the original.

a processed substrate count a cleaning count as original recovery processing a pressing count corresponding to a shot count an accumulated exposure amount to ultraviolet light, used to cure a resin a coefficient calculated from a change amount obtained by accumulating pieces of image detection information and detected images of an original pattern in time series a release force required to separate the original from the substrate coefficient calculated from a change in release force FIG. 4 is a view showing an arrangement in which the imprint processing unit 100 shown in FIG. 1 is accommodated in a chamber 200 for preventing entrance of a foreign substance by maintaining an imprint environment at a predetermined temperature and humidity.

An original stocker 28 serves as an original storage unit for storing a plurality of originals. An original replacement robot 29 serving as a conveyance unit can extract the new original 18 from the original stocker 28 to convey it to the original chuck 17 as the original holding position of the transfer unit, and recover the old original 18 from the original chuck 17. The original replacement robot 29 also has a function of loading/unloading the original into/from the apparatus via an original pod (not shown). The original replacement robot 29 has a rotation mechanism, upward/downward movement function, horizontal-direction movement function, and hand expansion/contraction function.

The control unit 400 includes a notification unit 401, a selection unit 402, and a management unit 403. The notification unit 401 can notify a control computer 500 and a display unit 30 of warning information via a network. In response to this, the display unit 30 can display an apparatus state. To improve the productivity and keep a manufacturing error within a predetermined range, the selection unit 402 selects the appropriate original 18, and executes conveyance control of the original 18. The management unit 403 manages pieces of information of the originals stored in the original stocker 28. The information of the original includes information pertaining to a drawing error of the pattern drawn on the original, alignment mark information for performing alignment between the original head 16 and the original 18, and information pertaining to the deterioration of the original such as a use count and a cleaning count.

Figure 5:
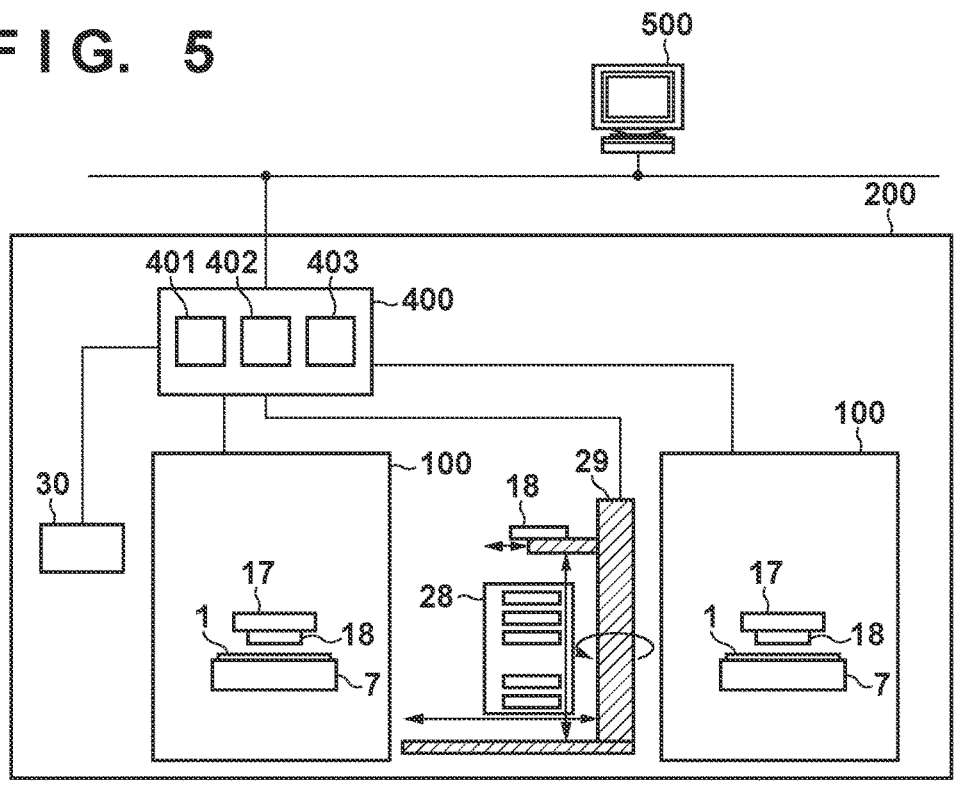
FIG. 5 is a view showing the arrangement of an imprint apparatus in which a chamber accommodates two imprint processing units shown in FIG. 1.

The present invention is also applicable to an arrangement including a plurality of transfer units (imprint processing units). FIG. 5 shows, as an example, an arrangement in which one chamber 200 accommodates two imprint processing units 100. In this arrangement, the respective imprint processing units can share the control computer 500, display unit 30, control unit 400, original stocker 28, and original replacement robot 29. The display unit 30, original stocker 28, and original replacement robot 29 need not be shared, and may be individually provided for each imprint processing unit.

FIGS. 6A and 6B are tables for explaining, by comparison with a conventional technique, the accumulated processed substrate count of each original when the imprint processing shown in FIG. 5 sequentially performs lot processes.

In the apparatus shown in FIG. 5, five originals A to E as originals which can process the same lot and on which the same pattern has been drawn are stored in the original stocker 28. A management unit 403 stores, for example, information of the accumulated processing count of each original in the transfer unit. Note that the information may be managed by the control computer 500. The "accumulated processing count in the transfer unit" may be an accumulated imprint execution count or the accumulated number (accumulated processed substrate count) of substrates having undergone imprint processing. The following description will be given by assuming that the accumulated processed substrate count is managed.

Referring to FIGS. 6A and 6B, the accumulated processed substrate counts of the originals A to E before the start of lot processing are 60, 90, 0, 80, and 50, respectively. The use limit count of each original can be obtained by experiment but is set to 100 in this example. This example assumes that the first lot with a lot processing substrate count of 40, the second lot with a lot processing substrate count of 20, and the third lot with a lot processing substrate count of 80 are sequentially processed in the order named.

FIG. 6A shows the accumulated processing count of each original at the end of each lot according to the conventional technique. FIG. 6B shows the accumulated processing count of each original at the end of each lot according to this embodiment.

In the conventional technique, each original is only replaced in the order of conveyance to the stocker every time the processing count reaches a predetermined count indicating the use limit. To the contrary, in this embodiment, an original replacement operation count is made as small as possible by managing a use history of each original, and selecting an original based on the use history. Replacement of the original can be controlled to be performed between lots. An outline of the processing of the selection unit 402 according to the embodiment is as follows. That is, the selection unit 402 obtains information of an expected processing count to be processed by the transfer unit in a lot, and obtains information of the accumulated processing count, in the transfer unit, of each original in the original stocker 28. After that, the selection unit 402 preferentially selects, from the plurality of originals in the original stocker 28, an original whose process enable count before the accumulated processing count reaches a predetermined count is equal to or larger than the expected processing count.

A practical example of this processing will be described below with reference to FIGS. 7 and 8.

FIG. 7 is a view for explaining, by comparison with the conventional technique, the use order of the originals when the imprint apparatus shown in FIG. 5 sequentially performs lot processes. In the chamber 200 shown in FIG. 5, the left imprint processing unit 100 is set as the first booth and the right imprint processing unit 100 is set as the second booth. FIG. 8 is a flowchart illustrating original conveyance processing which can be executed by the control unit 400 in the imprint apparatus shown in FIG. 5. A processing sequence will be described below with reference to FIGS. 6A, 6B, 7, and 8.

In step S201, the control unit 400 obtains a usable booth count. For example, the usable booth count is 4 for an imprint apparatus in which the chamber 200 accommodates four imprint booths, and 1 for the apparatus arrangement shown in FIG. 4. Since this example assumes the apparatus arrangement shown in FIG. 5, 2 is obtained as the usable booth count.

In step S202, the control unit 400 obtains information of the expected processing count (lot size) to be processed in a lot. In this example, the expected processing count (lot size) indicates the number of substrates to be processed in the lot. In the example shown in FIGS. 6A and 6B, when processing the first lot, the lot size representing the number of substrates to be processed is 40. The information of the lot size is obtained from the control computer 500. Note that the lot size information may be input from an input/output device (not shown) such as a keyboard terminal, CD drive, or USB drive.

In step S203, the control unit 400 obtains information of an original usable in the lot from the control computer 500. Alternatively, this information may be input from the input/output device (not shown) such as a keyboard terminal, CD drive, or USB drive.

In step S204, the control unit 400 calculates the processable substrate count of each original based on the accumulated processed substrate count and original use limit count of each original included in the original information obtained in step S203, and calculates the sum of the processable substrate counts. The control unit 400 compares the sum of the processable substrate counts with the lot size. If the sum of the processable substrate counts (process enable counts) is equal to or larger than the lot size (that is, the expected processing count), the process advances to step S205; otherwise, the process advances to step S210.

In step S210, it is impossible to process all the substrates, the number of which corresponds to the lot size, with the originals stored in the apparatus, and thus the notification unit 401 operates. The notification unit 401 notifies the control computer 500 and the display unit 30 of an original request message or an original shortage error message as warning information. In response to the notified message, the display unit 30 can display a warning.

In step S205, the control unit 400 determines the number of substrates to be processed in each booth. If the imprint apparatus includes a plurality of transfer units, the expected processing count to be processed in the lot is distributed to the plurality of transfer units. In this example, since the lot size of the first lot is 40 and the usable booth count is 2, the control unit 400 determines that the expected processing count is divided into the first and second booths and a series of imprint processes is executed for 20 substrates in each booth.

In step S206, the control unit 400 determines whether sufficient originals whose use counts do not reach the use limits, respectively, during the lot processing exist in the apparatus. If sufficient originals whose use counts do not reach the use limits, respectively, during the lot processing exist in the apparatus, the process advances to step S207; otherwise, the process advances to step S211. For example, if there is no original whose processable substrate count (process enable count) is equal to or larger than the lot size (that is, the expected processing count), the process advances to step S211.

In the example shown in FIGS. 6A and 6B, in the first lot processing, it is determined whether there are at least two originals capable of sequentially processing 20 substrates calculated in step S205, which correspond to the two booths. In this example, it is found that there are three originals A, C, and E whose process enable counts before the start of the lot processing are larger than 20.

In step S211, it is necessary to replace the original during the lot processing, and thus the notification unit 401 operates. The notification unit 401 notifies the control computer 500 and the display unit 30 of a lot interruption warning message or original request message. In response to the notified message, the display unit 30 can display a corresponding warning message.

In step S207, the selection unit 402 determines whether an original whose accumulated processed substrate count after the end of the lot is equal to the processing limit exists in the apparatus. If such original exists, the selection unit 402 preferentially selects and uses the original for the lot processing. Referring to FIG. 6B, the original D has the process enable count before the start of the lot processing which is 20 equal to the number of substrates to be processed in one booth, and has the accumulated processing count after the end of the lot which is equal to 100 as the processing limit. The selection unit 402 selects and uses the original D for the first lot.

In step S208, the selection unit 402 selects the original whose accumulated processed substrate count after the end of the lot does not reach the processing limit. If there are a plurality of such originals, the selection unit 402 selects the original which has been loaded into the apparatus first. In FIG. 6B, the original A is selected for the first lot.

In step S209, the selection unit 402 sends a command to the original replacement robot 29 to convey the selected original to the original head 16 of each booth.

The effect obtained by the processing sequence shown in FIG. 8 will be described by comparison with the conventional technique with reference to FIG. 7. Referring to FIG. 7, a number described in an arrow indicates the number of substrates to be processed, and an arrow with "Ex" represents an original replacement operation.

If the first lot processing is executed using the originals A and D selected by the processing according to this embodiment, it ends at time t1. According to the conventional technique, if the originals A and B are selected in the order of loading to the apparatus, and the first lot processing is executed, the original B reaches its processing limit (100 substrates) when 10 substrates are processed, and the lot processing is interrupted. Then, the original replacement robot 29 receives the original B from the original chuck 17, and recovers and conveys it to the original stocker 28. Furthermore, the original replacement robot 29 obtains the original C stored in the original stocker 28, and conveys it to the original chuck 17. After that, the first lot processing is returned, and ends at time t2.

The first lot processing according to this embodiment ends earlier than that according to the conventional technique by the time corresponding to the difference between time t1 and time t2 (effect 1). Furthermore, in the conventional technique, it is necessary to interrupt the lot processing midway to replace the original. In this case, a manufacturing error of a product may fall outside an allowable range due to a change in apparatus state caused by the interruption. On the other hand, according to this embodiment, since it is not necessary to interrupt the lot processing to replace the original, there is no change in apparatus state by interruption, and thus a manufacturing error of a product does not fall outside the allowable range (effect 2).

If the second lot processing for processing 20 substrates and the third lot processing for processing 80 substrates are performed following the first lot processing, the three lots end at time t5 in the conventional technique and at time t4 in this embodiment, as shown in FIG. 7. It is apparent from FIG. 7 that the two effects described with reference to the first lot are conspicuously produced.

Figure 8:
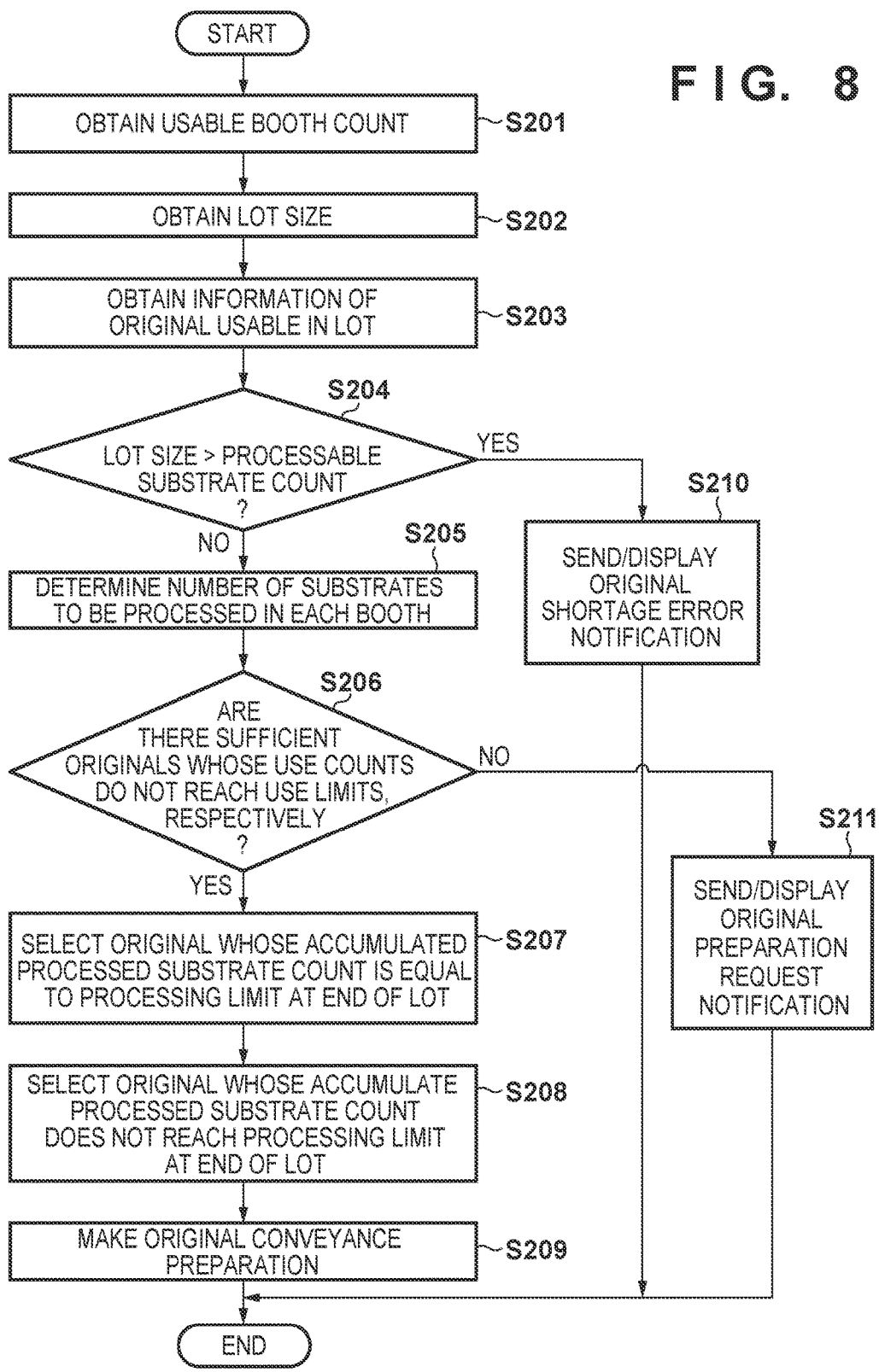
FIG. 8 is a flowchart illustrating processing by the imprint apparatus according to the embodiment.
Figure 9:
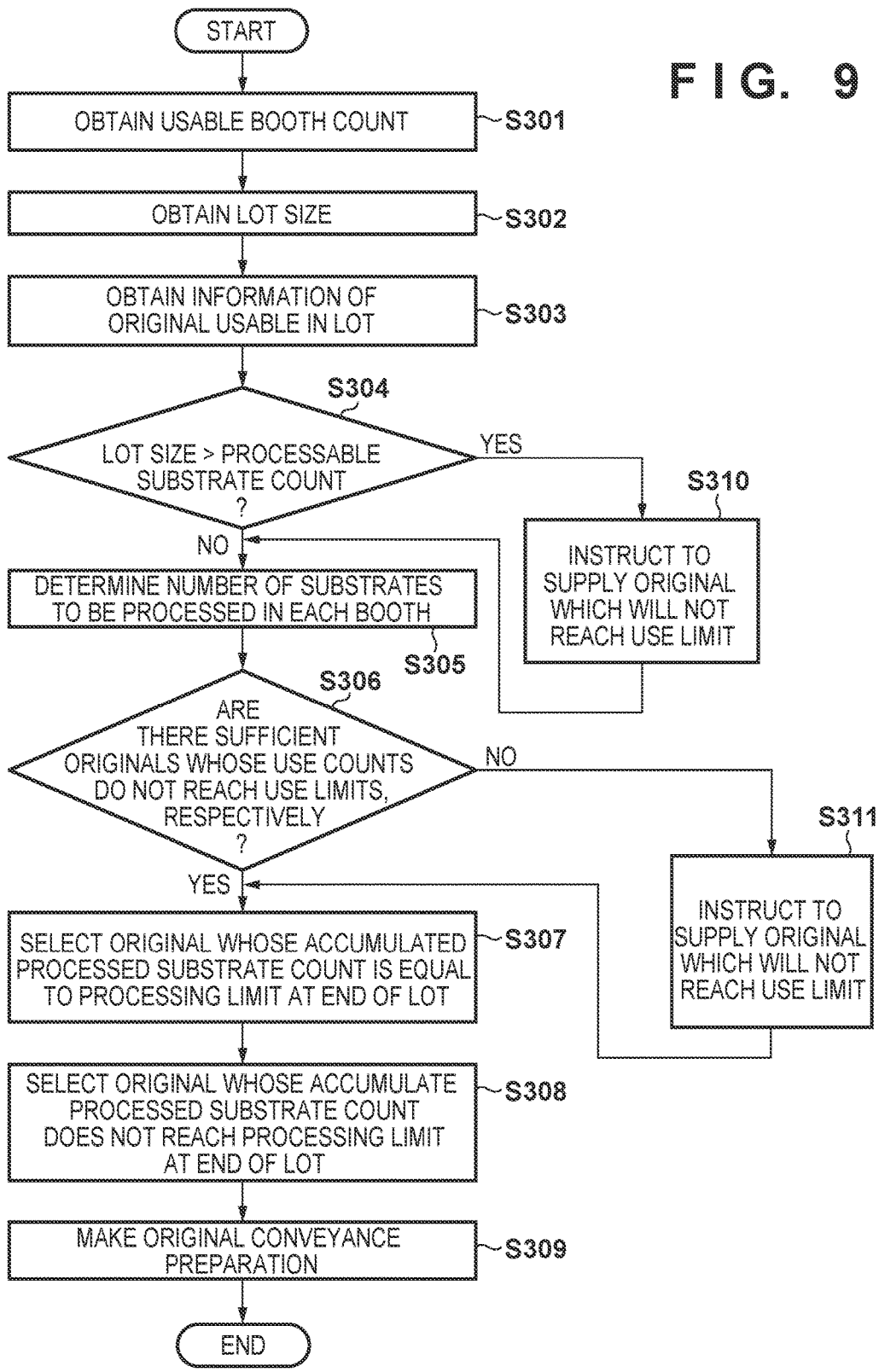
FIG. 9 is a flowchart illustrating processing by a control computer according to the embodiment.

FIG. 8 described above exemplifies the processing which can be executed by the control unit 400. However, the control computer 500 can execute the same processing. FIG. 9 is a flowchart illustrating original conveyance processing in the imprint apparatus shown in FIG. 5 when the control computer 500 executes the processing.

In step S301, the control computer 500 obtains a usable booth count. For example, the usable booth count is 4 for an imprint apparatus in which the chamber 200 accommodates four imprint booths, and 1 for the apparatus arrangement shown in FIG. 4. Since this example assumes the apparatus arrangement shown in FIG. 5, 2 is obtained as the usable booth count.

In step S302, the control computer 500 obtains a lot size representing the number of substrates to be processed in a lot. In the example shown in FIGS. 6A and 6B, when processing the first lot, the lot size representing the number of substrates to be processed is 40. The lot size is determined based on, for example, a product production plan, and the information is directly input to the control computer 500.

In step S303, the control computer 500 obtains information of an original usable in the lot. This information can be centrally managed by the control computer 500, and distributed to the control unit 400 via the network immediately before manufacturing products.

In step S304, the control computer 500 calculates the processable substrate count of each original based on the accumulated processed substrate count and original use limit count of each original included in the original information obtained in step S303, and calculates the sum of the processable substrate counts. The control computer 500 compares the sum of the processable substrate counts with the lot size. If the sum of the processable substrate counts (process enable counts) is equal to or larger than the lot size (that is, the expected processing count), the process advances to step S305; otherwise, the process advances to step S310.

In step S310, the control computer 500 instructs the target imprint apparatus to supply the original which will not reach the use limit during the lot processing. With this instruction, an automatic original conveyance apparatus (not shown) can make automatic conveyance preparation from an original storage apparatus (not shown) in a semiconductor manufacturing factory. Alternatively, an operator may directly carry the corresponding original to the imprint apparatus.

In step S305, the control computer 500 determines the number of substrates to be processed in each booth. In this example, since the lot size of the first lot is 40 and the usable booth count is 2, the control computer 500 determines that the number of substrates to be processed is divided into the first and second booths and a series of imprint processes is executed for 20 substrates in each booth. The control unit 400 of the imprint apparatus is notified of the determination information via the network.

In step S306, the control computer 500 determines, whether sufficient originals whose use counts do not reach the use limits, respectively, during the lot processing exist in the apparatus. If sufficient originals whose use counts do not reach the use limits, respectively, during the lot processing exist in the apparatus, the process advances to step S307; otherwise, the process advances to step S311. For example, if there is no original whose processable substrate count (process enable count) is equal to or larger than the lot size (that is, the expected processing count), the process advances to step S311.

In the example shown in FIGS. 6A and 6B, in the first lot processing, it is determined whether there are at least two originals capable of sequentially processing 20 substrates calculated in step S205, which correspond to the two booths. In this example, it is found that there are three originals A, C, and E whose process enable counts before the start of the lot processing are larger than 20.

In step S311, the control computer 500 instructs the target imprint apparatus to supply the original which will not reach the use limit during the lot processing. With this instruction, the automatic original conveyance apparatus (not shown) can make automatic conveyance preparation from the original storage apparatus (not shown) in the semiconductor manufacturing factory. Alternatively, an operator may directly carry the corresponding original to the imprint apparatus. Note that the above-described processing in step S310 may be collectively executed in step S311.

In step S307, the control computer 500 determines whether an original whose accumulated processed substrate count after the end of the lot is equal to the processing limit exists in the apparatus. If such original exists, the control computer 500 instructs the imprint apparatus to select and use the original for the lot processing. In step S308, the control computer 500 selects the original whose accumulated processed substrate count after the end of the lot does not reach the processing limit, and notifies the imprint apparatus of it. If there are a plurality of such originals, the original which has been loaded into the apparatus first is selected. In FIG. 6B, the original A is selected for the first lot.

In step S309, the control computer 500 sends a command to the original replacement robot 29 to convey the selected original to the original head 16 of each booth.

Figure 10:
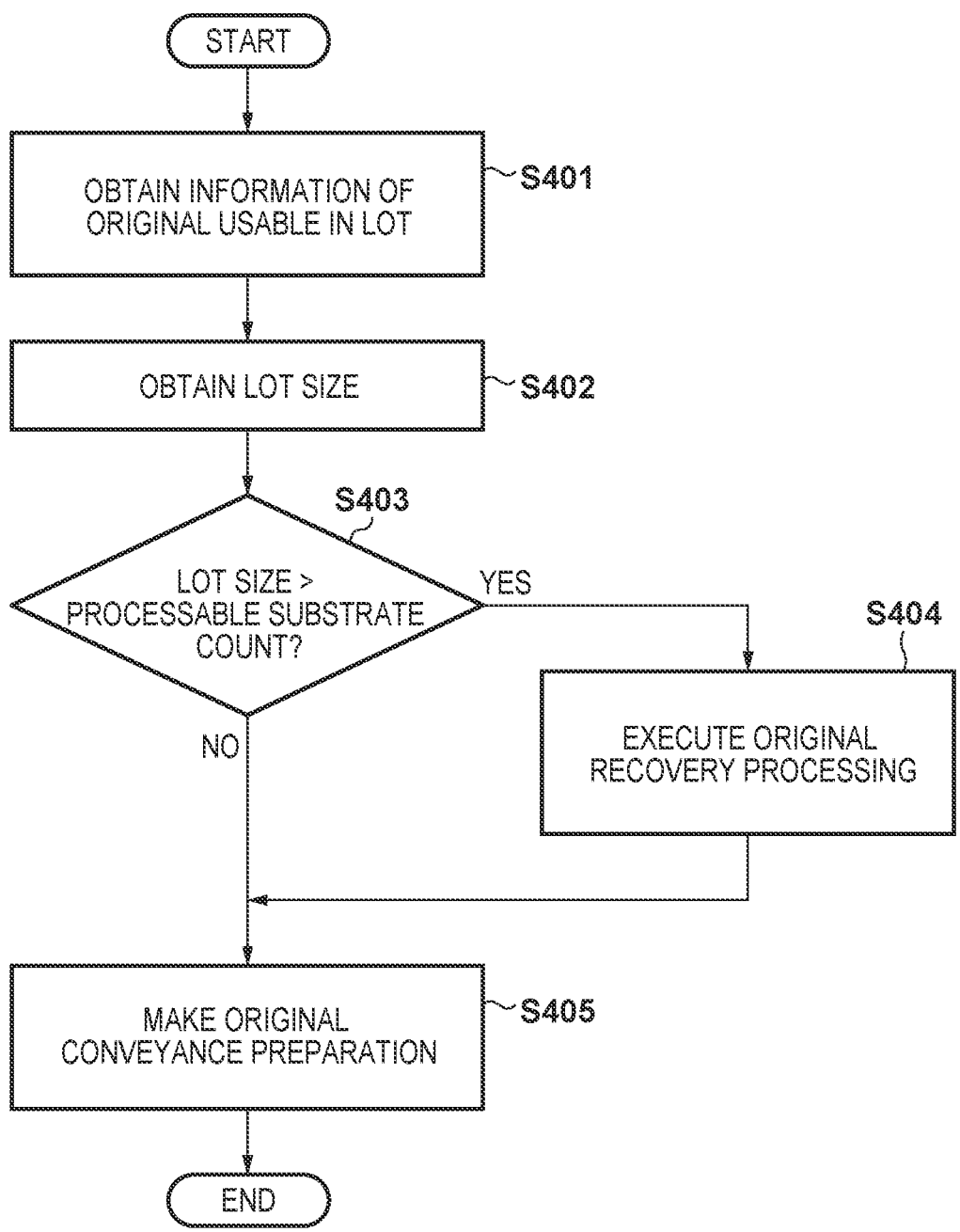
FIG. 10 is a flowchart illustrating original recovery processing according to the embodiment.

FIG. 10 is a flowchart illustrating original recovery processing in the imprint apparatus shown in FIG. 4.

In step S401, the control unit 400 obtains information of an original usable in a lot from the control computer 500. Alternatively, this information may be input from the input/output device (not shown) such as a keyboard terminal, CD drive, or USB drive.

In step S402, the control unit 400 obtains, from the control computer 500, a lot size representing the number of substrates to be processed in the lot. Note that information of the lot size may be input from the input/output device (not shown) such as a keyboard terminal, CD drive, or USB drive.

In step S403, the control unit 400 calculates the processable substrate count of each original based on the accumulated processed substrate count and original use limit count of each original included in the original information obtained in step S401. For each original, the control unit 400 compares the processable substrate count with the lot size obtained in step S402. If the processable substrate count (process enable count) is equal to or larger than the lot size (that is, the expected processing count), the process advances to step S405; otherwise, the process advances to step S404.

In step S404, the control unit 400 sends a command to execute original recovery processing of the corresponding original. An example of the original recovery processing is original cleaning processing. The original recovery processing may be implemented by providing an original recovery mechanism in the imprint apparatus. Alternatively, the original may be temporarily extracted outside the apparatus, and returned to the imprint apparatus after the original recovery processing is executed.

In step S405, the selection unit 402 sends a command to the original replacement robot 29 to convey the selected original to the original head 16.

Figure 11:
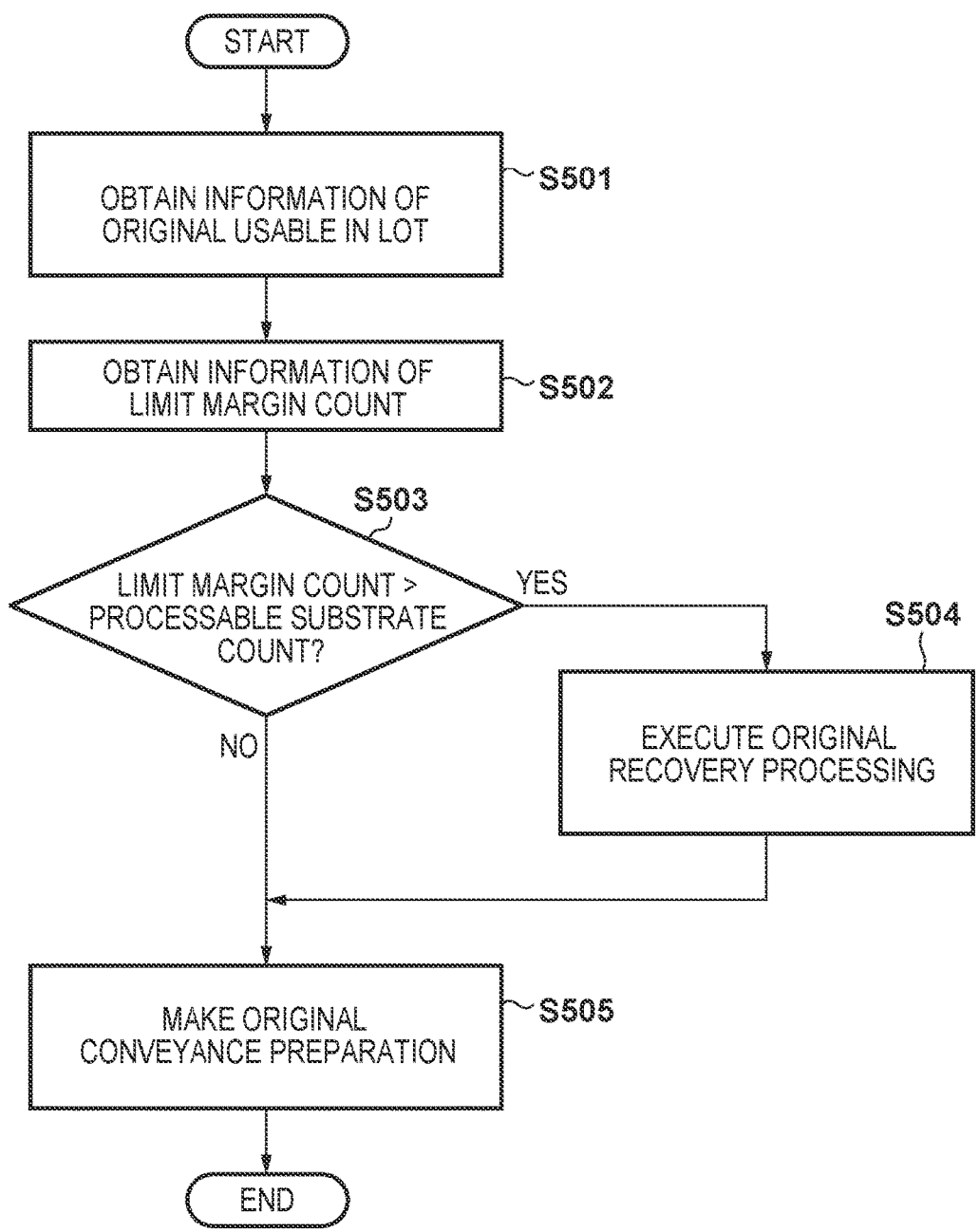
FIG. 11 is a flowchart illustrating another example of the original recovery processing according to the embodiment.

FIG. 11 is a flowchart illustrating another example of the original recovery processing in the imprint apparatus shown in FIG. 4.

In step S501, the control unit 400 obtains information of an original usable in a lot from the control computer 500. Alternatively, this information may be input from the input/output device (not shown) such as a keyboard terminal, CD drive, or USB drive.

In step S502, the control unit 400 obtains information of a predetermined limit margin count. Note that the information is a parameter for setting a margin with respect to a substrate count representing the use limit of the original to execute recovery processing. This information can be obtained from the control computer 500 but may be input from the input/output device (not shown) such as a keyboard terminal, CD drive, or USB drive.

In step S503, the control unit 400 calculates the processable substrate count of each original based on the accumulated processed substrate count and original use limit count of each original included in the original information obtained in step S501. The control unit 400 compares the processable substrate count with the limit margin count. If the processable substrate count (process enable count) is equal to or larger than the limit margin count for each original, the process advances to step S505; otherwise, the process advance to step S504.

In step S504, the control unit 400 sends a command to execute original recovery processing of the corresponding original. An example of the original recovery processing is original cleaning processing. The original recovery processing may be implemented by providing an original recovery mechanism in the imprint apparatus. Alternatively, the original may be temporarily extracted outside the apparatus, and returned to the imprint apparatus after the original recovery processing is executed.

In step S505, the selection unit 402 sends a command to the original replacement robot 29 to convey the selected original to the original head 16.

The above embodiment has described the method of managing the degree of deterioration of an original by the number of substrates to be processed. The present invention, however, is not limited to this. For example, it is possible to obtain the same effects by, for example, an original cleaning count, a pressing count, an accumulated exposure amount, numerical detected image information, a coefficient calculated from a change in detected image, a release force, or a coefficient calculated from a change in release force. Instead of using the number of substrates to be processed as information for determining the degree of deterioration of an original, a residual processable count can be used. The residual processable count may be, for example, a residual processable substrate counts that indicates the remaining number of substrates until the processed number reaches an upper limit, a residual cleaning count, or a residual pressing count.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern on a substrate by using a lithography apparatus and a step of processing (for example, developing) the substrate on which the pattern is formed in the above step. The manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

Other Embodiments

Embodiment (s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment (s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment (s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-023543, filed Feb. 9, 2015, and No. 2016-003695, filed Jan. 12, 2016, which are hereby incorporated by reference herein in their entirety.

What is claimed is:

1. A lithography apparatus comprising:
a transfer unit;
an original storage unit configured to store a plurality of originals;
a control unit configured to select, from the plurality of originals, an original; and
a conveyance unit configured to extract, from the original storage unit, the original selected by the control unit, and convey the extracted original to an original holding position of the transfer unit, the transfer unit being configured to transfer, to a substrate, a pattern formed on the extracted original,
wherein the control unit:
obtains information of an expected processing count to be processed in a lot by the transfer unit,
obtains information of an accumulated processing count, in the transfer unit, of each of the plurality of originals in the original storage unit,
selects, from the plurality of originals, an original whose process enable count, which is a count indicating a difference between a predetermined count and an accumulated processing count of the selected original, is equal to the expected processing count, and
in a case where there is no original whose process enable count is equal to the expected processing count, selects, from the plurality of originals, an original whose process enable count is larger than the expected processing count.

2. The apparatus according to claim 1, wherein in a case where a sum of process enable counts of the respective originals is smaller than the expected processing count, the control unit outputs an original shortage error message or an original request message.

3. The apparatus according to claim 1, wherein in a case where there is no original whose process enable count is not smaller than the expected processing count, the control unit outputs a lot interruption warning or an original request message.

4. The apparatus according to claim 2, further comprising:
a display unit configured to display a corresponding warning in response to the original shortage error message or the original request message from the control unit.

5. The apparatus according to claim 1, wherein for an original whose process enable count is smaller than the expected processing count, the control unit sends a command to execute original recovery processing of the original.

6. The apparatus according to claim 1, wherein for originals whose sum of the process enable counts is smaller than a predetermined limit margin count, the control unit sends a command to execute original recovery processing of the originals.

7. The apparatus according to claim 1, wherein a plurality of transfer units are included in the apparatus, and the expected processing count to be processed in the lot is distributed among the plurality of transfer units.

8. An imprint apparatus comprising:
an imprint processing device;
a storage configured to store a plurality of originals;
a controller configured to select, from the plurality of originals, an original; and
a conveyor configured to extract, from the storage, the original selected by the controller, and convey the extracted original to an original holding position of the imprint processing device, the imprint processing device being configured to transfer, to a substrate, a pattern formed on the extracted original,
wherein the controller:
obtains information of an expected processing count to be processed in a lot by the imprint processing device,
obtains information of an accumulated processing count, in the imprint processing device, of each of the plurality of originals in the storage,
selects, from the plurality of originals, an original whose process enable count, which is a count indicating a difference between a predetermined count and an accumulated processing count of the selected original, is equal to the expected processing count, and
in a case where there is no original whose process enable count is equal to the expected processing count, selects, from the plurality of originals, an original whose process enable count.

9. The apparatus according to claim 8, wherein in a case where a sum of process enable counts of the respective originals is smaller than the expected processing count, the controller outputs an original shortage error message or an original request message.

10. The apparatus according to claim 8, wherein in a case where there is no original whose process enable count is not smaller than the expected processing count, the controller outputs a lot interruption warning or an original request message.

11. The apparatus according to claim 9, further comprising:
a display configured to display a corresponding warning in response to the original shortage error message or the original request message from the controller.

12. The apparatus according to claim 8, wherein for an original whose process enable count is smaller than the expected processing count, the controller sends a command to execute original recovery processing of the original.

13. The apparatus according to claim 8, wherein for originals whose sum of the process enable counts is smaller than a predetermined limit margin count, the controller sends a command to execute original recovery processing of the originals.

14. The apparatus according to claim 8, wherein a plurality of imprint processing devices are included in the apparatus, and the expected processing count to be processed in the lot is distributed among the plurality of imprint processing devices.

15. A lithography apparatus comprising:
an original storage unit configured to store a plurality of originals;

a transfer unit configured to transfer a pattern formed on an original to a substrate;

a control unit configured to select, from the plurality of originals, an original; and a conveyance unit configured to convey the original selected by the control unit to an original holding position of the transfer unit, wherein the control unit:

obtains information of an expected processing count to be processed in a lot by the transfer unit, obtains information of an accumulated processing count, in the transfer unit, of each of the plurality of originals in the original storage unit, and selects, from the plurality of originals, an original whose process enable count, which is a count indicating a difference between a predetermined count and an accumulated processing count of the selected original, is larger than or equal to the expected processing count.

16. The apparatus according to claim 15, wherein in a case where a sum of process enable counts of the respective originals is smaller than the expected processing count, the control unit outputs an original shortage error message or an original request message.

17. The apparatus according to claim 15, wherein in a case where there is no original whose process enable count is not smaller than the expected processing count, the control unit outputs a lot interruption warning or an original request message.

18. The apparatus according to claim 16, further comprising: a display unit configured to display a corresponding warning in response to the original shortage error message or the original request message from the control unit.

19. The apparatus according to claim 15, wherein for an original whose process enable count is smaller than the expected processing count, the control unit sends a command to execute original recovery processing of the original.

20. The apparatus according to claim 15, wherein for originals whose sum of the process enable counts is smaller than a predetermined limit margin count, the control unit sends a command to execute original recovery processing of the originals.

21. The apparatus according to claim 15, wherein a plurality of transfer units are included in the apparatus, and the expected processing count to be processed in the lot is distributed among the plurality of transfer units.

22. An imprint apparatus comprising:

a storage configured to store a plurality of molds;

an imprint processing device configured to form a pattern on a substrate using a mold;

a controller configured to select, from the plurality of molds, a mold; and a conveyor configured to convey the mold selected by the controller to a mold holding position of the imprint processing device, wherein the controller:

obtains information of an expected processing count to be processed in a lot by the imprint processing device, obtains information of an accumulated processing count, in the imprint processing device, of each of the plurality of molds in the storage, and selects, from the plurality of molds, a mold whose process enable count, which is a count indicating a difference between a predetermined count and an accumulated processing count of the selected mold, is larger than or equal to the expected processing count.

23. The apparatus according to claim 22, wherein in a case where a sum of process enable counts of the respective molds is smaller than the expected processing count, the controller outputs a mold shortage error message or a mold request message.

24. The apparatus according to claim 22, wherein in a case where there is no mold whose process enable count is not smaller than the expected processing count, the controller outputs a lot interruption warning or a mold request message.

25. The apparatus according to claim 23, further comprising: a display configured to display a corresponding warning in response to the mold shortage error message or the mold request message from the controller.

26. The apparatus according to claim 22, wherein for a mold whose process enable count is smaller than the expected processing count, the controller sends a command to execute mold recovery processing of the mold.

27. The apparatus according to claim 22, wherein for molds whose sum of the process enable counts is smaller than a predetermined limit margin count, the controller sends a command to execute mold recovery processing of the molds.

28. The apparatus according to claim 22, wherein a plurality of imprint processing devices are included in the apparatus, and the expected processing count to be processed in the lot is distributed among the plurality of imprint processing devices.

* * * * *